(12) United States Patent
Sun et al.

(10) Patent No.: US 10,948,544 B2
(45) Date of Patent: Mar. 16, 2021

(54) BATTERY SAFETY IDENTIFYING METHOD AND METHOD FOR SETTING HAZARD LEVELS OF BATTERY INTERNAL SHORT CIRCUIT AND WARNING SYSTEM USING THE SAME

(71) Applicant: INDUSTRIAL TECHNOLOGY RESEARCH INSTITUTE, Hsinchu (TW)

(72) Inventors: Chein-Chung Sun, Kaohsiung (TW); Chun-Hung Chou, Tainan (TW); Deng-Tswen Shieh, Hsinchu (TW); Che-Wei Chu, Changzhi Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 231 days.

(21) Appl. No.: 16/296,826

(22) Filed: Mar. 8, 2019

(65) Prior Publication Data
US 2019/0277916 A1    Sep. 12, 2019

Related U.S. Application Data

(60) Provisional application No. 62/640,056, filed on Mar. 8, 2018.

(51) Int. Cl.
*G01R 31/367* (2019.01)
*H02J 7/00* (2006.01)
(Continued)

(52) U.S. Cl.
CPC ....... *G01R 31/367* (2019.01); *G01R 31/3646* (2019.01); *G01R 31/374* (2019.01);
(Continued)

(58) Field of Classification Search
CPC .............. G01R 31/367; G01R 31/3835; G01R 31/3646; G01R 37/374; G01R 37/389;
(Continued)

(56) References Cited

U.S. PATENT DOCUMENTS 8,179,139 B2   5/2012  Kawasumi et al.
8,334,698 B2   12/2012  Tammer et al.
(Continued)

FOREIGN PATENT DOCUMENTS

CN    106526493 A    3/2017
CN    163842043 A    6/2017
(Continued)

*Primary Examiner* — David V Henze-Gongola
(74) *Attorney, Agent, or Firm* — Birch, Stewart, Kolasch & Birch, LLP

(57) ABSTRACT

A battery safety identifying method is provided. The method includes the following steps. A voltage drop and a voltage drop rate are detected when a battery is abnormal. A duration time of the voltage drop and a voltage recovery ratio are detected when the battery is abnormal. A surface temperature or a temperature rise rate is detected when the battery is abnormal. A plurality of hazard levels of battery abnormality and at least one protection mechanism are set according to the voltage drop, the voltage drop rate, the voltage recovery ratio and the surface temperature or the temperature rise rate.

17 Claims, 11 Drawing Sheets

50% < State of Charge < 75% (Initial stage)

| Voltage recovery rate \ Voltage drop | <50mV | 50-100mV | 100-200mV | >200mV |
|---|---|---|---|---|
| >10mV/s | Safe | Safe | Warning | Dangerous |
| 1-10mV/s | Safe | Warning | Dangerous | Dangerous |
| <1mV/s | Warning | Dangerous | Dangerous | Dangerous |

(51) Int. Cl.
*G01R 31/3835* (2019.01)
*G01R 31/36* (2020.01)
*G01R 31/374* (2019.01)
*H01M 10/48* (2006.01)
*H01M 10/44* (2006.01)
*H01M 10/613* (2014.01)
*H01M 10/633* (2014.01)
*H01M 10/42* (2006.01)
*G08B 21/18* (2006.01)

(52) U.S. Cl.
CPC ....... *G01R 31/3835* (2019.01); *G08B 21/185* (2013.01); *H01M 10/425* (2013.01); *H01M 10/443* (2013.01); *H01M 10/486* (2013.01); *H01M 10/613* (2015.04); *H01M 10/633* (2015.04); *H02J 7/0029* (2013.01); *H01M 2010/4271* (2013.01)

(58) Field of Classification Search
CPC .............. G08B 21/185; H01M 10/486; H01M 10/443; H01M 10/613; H01M 10/633; H01M 10/425; H01M 2010/4271; H01M 2200/00; H02J 7/0031; H02J 7/0091
See application file for complete search history.

(56) References Cited

U.S. PATENT DOCUMENTS

| | | | |
|---|---|---|---|
| 8,334,699 B2 * | 12/2012 | Asakura | G01R 31/52 324/426 |
| 8,866,444 B2 | 10/2014 | Stewart et al. | |
| 2015/0198673 A1 * | 7/2015 | Yang | G01R 31/385 429/61 |
| 2016/0061907 A1 | 3/2016 | Koba et al. | |
| 2020/0280108 A1 * | 9/2020 | Tomar | B60L 53/63 |
| 2020/0313152 A1 * | 10/2020 | Stefanopoulou | H01M 2/345 |

FOREIGN PATENT DOCUMENTS

| | | |
|---|---|---|
| CN | 107300137 A | 11/2017 |
| CN | 107728071 A | 2/2018 |
| EP | 2 521 213 B1 | 10/2014 |
| JP | 2006-262606 A | 9/2006 |
| JP | 2012-85455 A | 4/2012 |
| JP | 2015-129677 A | 7/2015 |
| TW | 201200890 A1 | 1/2012 |
| TW | 201318900 A1 | 5/2013 |
| TW | 201507239 A | 2/2015 |
| TW | I605629 B | 11/2017 |

* cited by examiner

| Capacity 4.8Ah | Penetration speed, penetration depth, stop-penetration condition | | | | | | | |
|---|---|---|---|---|---|---|---|---|
| | 0.01mm/s | 0.1mm/s | 2mm/s | 5mm/s | 7mm/s | 10mm/s | 15mm/s | 30mm/s |
| 100% SOC | A:4218mV<br>ΔV1:472mV<br>ΔV':5mV<br>Safe | A:4266mV<br>ΔV1:500mV<br>ΔV':200mV<br>Dangerous | A:4258mV<br>ΔV1:598mV<br>ΔV':254mV<br>Dangerous | A:4247mV<br>ΔV1:682mV<br>ΔV':1404mV<br>Dangerous | | | | |
| 75% SOC | | | | A:4043mV<br>ΔV1:809mV<br>ΔV':257mV<br>Safe | A:4038mV<br>ΔV1:899mV<br>ΔV':171mV<br>Safe | A:4017mV<br>ΔV1:1044mV<br>ΔV':174mV<br>Dangerous | A:3998mV<br>ΔV1:1958mV<br>ΔV':834mV<br>Dangerous | |
| 50% SOC | | | | | A:3822mV<br>ΔV1:970mV<br>ΔV':119mV<br>Safe | A:3798mV<br>ΔV1:1095mV<br>ΔV':198mV<br>Safe | A:3816mV<br>ΔV1:2252mV<br>ΔV':781mV<br>Warning | A:3809mV<br>ΔV1:3576mV<br>ΔV':3660mV<br>Warning |

FIG. 12

| Capacity | Penetration speed, penetration depth, stop-penetration condition | | | | | | | |
|---|---|---|---|---|---|---|---|---|
| 10Ah | 0.01mm/s | 0.1mm/s | 2mm/s | 5mm/s | 7mm/s | 10mm/s | 15mm/s | 30mm/s |
| 100% SOC | A:4157mV ΔV1:50mV ΔV':5mV Safe | A:4148mV ΔV1:49mV ΔV':5mV Safe | A:4152mV ΔV1:115mV ΔV'':1141mV Dangerous | A:4156mV ΔV1:93mV ΔV'':726mV Dangerous | A:4155mV ΔV1:94mV ΔV'':573mV Dangerous | | | |
| 75% SOC | | | A:3873mV ΔV1:70mV ΔV'':11mV Safe | A:3881mV ΔV1:223mV ΔV'':34mV Safe | A:3886mV ΔV1:35mV ΔV'':849mV Dangerous | A:3882mV ΔV1:103mV ΔV'':597mV Dangerous | A:3881mV ΔV1:376mV ΔV'':491mV Dangerous | |
| 50% SOC | | | | A:3677mV ΔV1:385mV ΔV'':84mV Warning | A:3670mV ΔV1:261mV ΔV'':46mV Warning | A:3668mV ΔV1:558mV ΔV'':66mV Warning | A:3676mV ΔV1:616mV ΔV'':131mV Warning | A:3668mV ΔV1:1883mV ΔV'':873mV Warning |

FIG. 13

State of Charge > 75% (Initial stage)

| Voltage recovery rate \ Voltage drop | <50mV | 50-100mV | >100mV |
|---|---|---|---|
| >10mV/s | Safe | Warning | Dangerous |
| 1-10mV/s | Warning | Dangerous | Dangerous |
| <1mV/s | Dangerous | Dangerous | Dangerous |

FIG. 14

State of Charge > 75% (Middle and late stages)

| Temperature rise rate \ Battery temperature | <70°C | 70-85°C | >85°C |
|---|---|---|---|
| <1.5°C/s | Safe | Warning | Dangerous |
| 1.5-5°C/s | Warning | Dangerous | Dangerous |
| >5°C/s | Dangerous | Dangerous | Dangerous |

FIG. 15

50% < State of Charge < 75% (Initial stage)

| Voltage recovery rate \ Voltage drop | <50mV | 50-100mV | 100-200mV | >200mV |
|---|---|---|---|---|
| >10mV/s | Safe | Safe | Warning | Dangerous |
| 1-10mV/s | Safe | Warning | Dangerous | Dangerous |
| <1mV/s | Warning | Dangerous | Dangerous | Dangerous |

FIG. 16

50% < State of Charge < 75% (Middle and late stages)

| Temperature rise rate \ Battery temperature | <70°C | 70-85°C | >85°C |
|---|---|---|---|
| <1.5°C/s | Safe | Warning | Dangerous |
| 1.5-5°C/s | Warning | Dangerous | Dangerous |
| >5°C/s | Dangerous | Dangerous | Dangerous |

FIG. 17

State of Charge < 50% (Initial stage)

| Voltage recovery rate \ Voltage drop | <50mV | 50-100mV | 100-200mV | >200mV |
|---|---|---|---|---|
| >10mV/s | Safe | Safe | Safe | Safe |
| 1-10mV/s | Safe | Safe | Safe | Warning |
| <1mV/s | Safe | Safe | Warning | Warning |

FIG. 18

State of Charge < 50% (Middle and late stages)

| Temperature rise rate \ Battery temperature | <70°C | 70-85°C | >85°C |
|---|---|---|---|
| <1.5°C/s | Safe | Warning | Dangerous |
| 1.5-5°C/s | Warning | Dangerous | Dangerous |
| >5°C/s | Dangerous | Dangerous | Dangerous |

FIG. 19

BATTERY SAFETY IDENTIFYING METHOD AND METHOD FOR SETTING HAZARD LEVELS OF BATTERY INTERNAL SHORT CIRCUIT AND WARNING SYSTEM USING THE SAME

This application claims the benefit of U.S. provisional application Ser. No. 62/640,056, filed Mar. 8, 2018, the disclosure of which is incorporated by reference herein in its entirety.

TECHNICAL FIELD

The disclosure relates in general to a method for detecting internal short circuit of a battery, and more particularly to a battery safety identifying method, a method for setting hazard levels of internal short circuit of the battery and a warning system using the same.

BACKGROUND

Internal short circuit (ISC) is the main reason to trigger thermal runaway in the lithium-ion battery. After internal short circuit occurs, the current flows into the internal short circuit points and generates a large amount of heat, which causes high temperature of the localized area of battery and may even trigger thermal runaway. Nowadays, battery internal short circuit mainly is detected by performing a penetration experiment by a stainless-steel nail. The penetration experiment is usually adopted as a simulation of real battery's internal short circuit and also a model used to determine whether the battery is going to thermal runaway. Conventional nail penetration will cause severe damage to the battery and generate a large amount of energy at short circuit at once. However, in many cases, the thermal runaway caused by the battery's internal short circuit is triggered by continuous accumulation of many abnormal minor short circuits. It is failed to accurately quantify the released energy at internal short circuit of battery and verify the hazard level by the conventional method which can merely result in either "pass" or "fail" binary condition, representing "safe" or "dangerous" respectively.

Therefore, there is a necessity to improve the conventional penetration experiment and make it closer to real internal short situation. Moreover, the levels of battery internal short circuit are needed to be graded to achieve battery safety identification and classification.

SUMMARY

According to one embodiment, a battery safety identifying method is provided. The method includes the following steps. A voltage drop and a voltage drop rate are detected when a battery is abnormal. A duration time of the voltage drop and a voltage recovery ratio within a limited time interval are detected when the battery is abnormal. A surface temperature or a temperature rise is detected when the battery is abnormal. A plurality of hazard levels of battery abnormality and at least one protection mechanism are set according to the voltage drop, the voltage drop rate, the voltage recovery ratio and the surface temperature or the temperature rise. When a first condition is met, the battery abnormality is set as a mild hazard. When the first condition is not met but a second condition is met, the battery abnormality is set as a moderate hazard. When both the first condition and the second condition are not met, the battery abnormality is set as a severe hazard, and the at least one protection mechanism is activated.

According to one embodiment, a method for setting hazard levels of battery internal short circuit includes the following steps. A penetration procedure to batteries with different states of charge is performed. A penetration parameter of the penetration procedure is set, wherein the penetration parameter includes a penetration speed and a stop-penetration condition. A voltage drop signal, a voltage recovery signal, a temperature signal and a temperature rise rate signal of each battery in the penetration procedure are recorded. A plurality of hazard levels related to the voltage drop signal and the voltage recovery signal of the battery is established according to the penetration result.

According to another embodiment, a warning system for identifying hazard levels of a battery is provided. The warning system includes a battery management system and an alarm system. The battery management system is configured to perform a battery safety identifying method to determine the state of battery abnormality. The alarm system is configured to display a light signal or emit an alarm according to the hazard levels.

The above and other aspects of the disclosure will become better understood with regards to the following detailed description of the preferred but non-limiting embodiment(s). The following description is made with reference to the accompanying drawings.

BRIEF DESCRIPTION OF THE DRAWINGS

FIG. 12 is a schematic diagram of creating battery hazard levels according to the states of charge and penetration parameters according to an embodiment of the present disclosure.

FIG. 13 is a schematic diagram of battery hazard levels created according to the states of charge and penetration parameters according to another embodiment of the present disclosure.

FIG. 14 is a correlation table of battery hazard levels created according to the voltage drop and the voltage recovery rate in a high state of charge.

FIG. 15 is a correlation table of battery hazard levels created according to the battery temperature and the temperature rise rate in a high state of charge.

FIG. 16 is a correlation table of battery hazard levels created according to the voltage drop and the voltage recovery rate in a medium capacity state of charge.

FIG. 17 is a correlation table of battery hazard levels created according to the battery temperature and the temperature rise rate in a medium capacity state of charge.

FIG. 18 is a correlation table of battery hazard levels created according to the voltage drop and the voltage recovery rate in a low state of charge.

FIG. 19 is a correlation table of battery hazard levels created according to the battery temperature and the temperature rise rate in a low state of charge.

DETAILED DESCRIPTION

Figure 1:
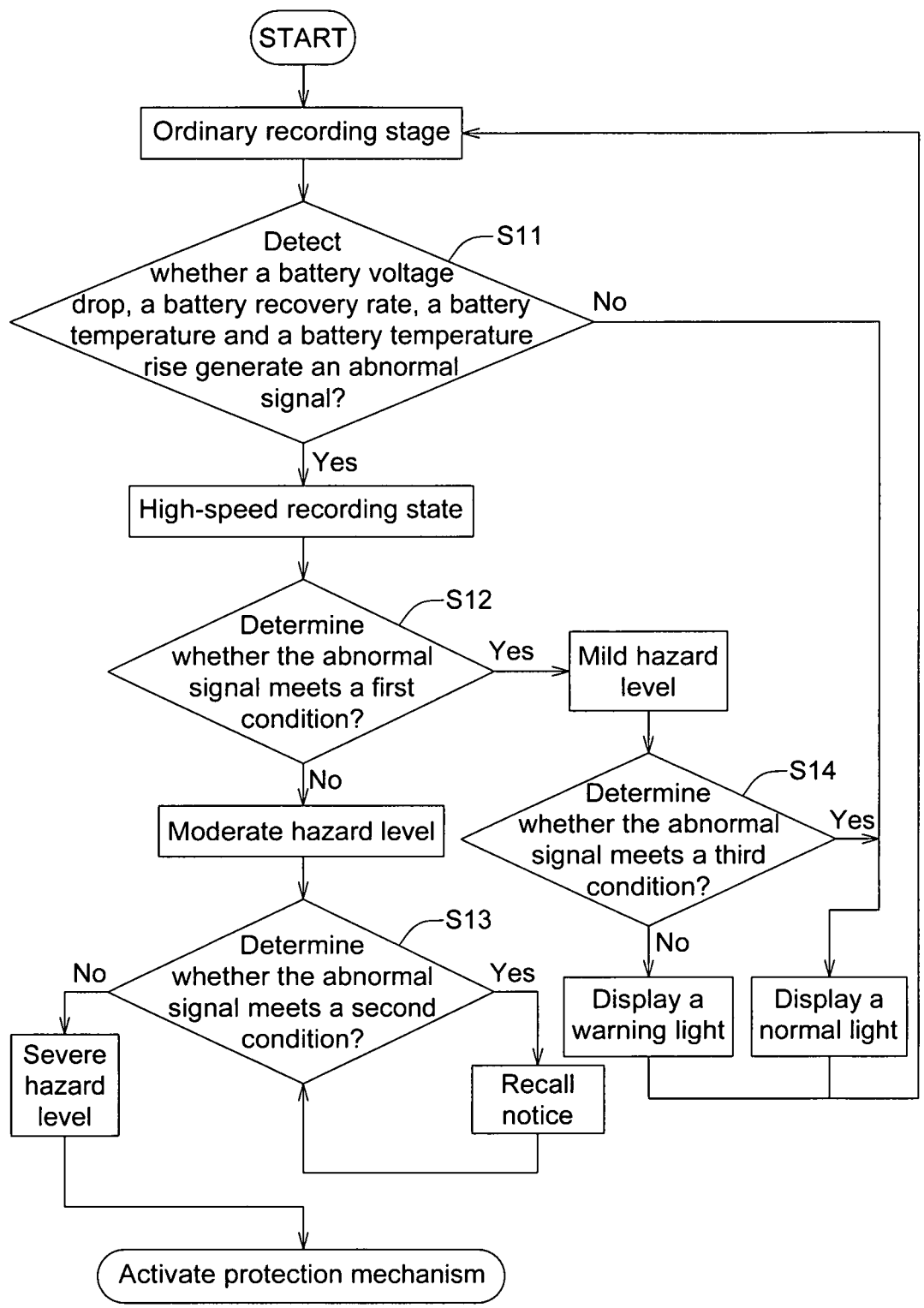
FIG. 1 is a flow diagram of a battery safety identifying method and a warning determination procedure according to an embodiment of the present disclosure.

Detailed descriptions of the disclosure are disclosed below with a number of embodiments. However, the disclosed embodiments are for explanatory and exemplary purposes only, not for limiting the scope of protection of the disclosure. Similar/identical designations are used to indicate similar/identical elements.

The present disclosure relates to a battery safety identifying method, a method for setting hazard levels of internal short circuit of a battery, and a warning system using the same, which can be used as an internal short circuit detection mechanism of the battery management system to determine the state of battery abnormality.

According to an embodiment of the present disclosure, a battery safety identifying method and a determination procedure are provided. Hazard levels of battery abnormality are set according to abnormal signals due to the parameters of battery, such as voltage, current, and temperature etc. For example, the "abnormal signal" occurs when the voltage drops suddenly. When abnormal voltage drop of the battery is not caused by normal charging/discharging current, the larger the abnormal voltage drop, the larger the instant short circuit current. Besides, the abnormal signal may occur when the voltage drop has an abnormal duration or an abnormal voltage recovery rate. The longer the duration of the abnormal voltage drop, the slower the voltage recovery rate, and the worse the battery safety. Since the voltage drop represents the release of short-circuit energy, a quick voltage recovery rate of the voltage drop indicates that the material has a robust defense and the battery is able to recover completely from damage. Also, the abnormal signal occurs when the abnormal voltage drop triggers a temperature rise. Normally, the higher voltage drop, the longer voltage drop duration, the slower voltage recovery rate and the larger volume of the abnormal release of battery energy increase the cell explore probability. Moreover, the abnormal signal can be the frequency of abnormity, and the higher the frequency of the above three abnormal signals caused by voltage drop, voltage drop duration and voltage recovery rate, the more likely the materials of the battery may deteriorate, and the above abnormal signals can be used as a reference for determining the degree of abnormality.

Moreover, the hazard levels of battery abnormality can be classified as a "normal level", a "warning level", a "recall level", and a "danger and protection activation level" according to the degree of abnormality. The normal level is when no abnormal signals occur. The warning level is when the abnormality of signal is mild. For example, the voltage drop is mild, the voltage recovery rate is quick, the voltage drop duration is short, or the temperature rise is lower than a setting range (for example, the setting value=1.5° C./sec). The recall level is when the abnormality of signal is moderate. For example, the voltage drop is moderate, the voltage recovery rate is slow, the voltage drop duration is long, or the temperature rise is within a setting range (for example, the setting value >1.5° C./sec) or the surface temperature of the battery is within a setting range (for example, 70° C. <the setting value <85° C.). The danger and protection activation level is when the abnormality of signal is severe. The hazard level of battery abnormality is classified as the danger and protection activation level when the voltage drop, the temperature or the rise rate of the temperature is over the range of the recall level and any of the following conditions is met. The conditions include: the temperature rise rate reaching a setting value (for example, the setting value >5° C./sec) and the temperature being over a default times (for example, 1.1 times) of an over-heated protection value or the surface temperature of the battery being larger than a setting value (for example, 85° C.). The danger and protection activation level indicates the cell is at the risk of explosion, and the users need to be informed and evacuated.

When the battery management system (BMS) determines that the hazard level of abnormality of signal is severe, the BMS can activate a protection mechanism to turn off the charging switch, and turn on the audio broadcasting or the escape alarm. If the battery has thermal management design, the BMS can activate a forced cooling function to turn the cooling mode to the maximum or turn on the battery energy leakage loop, through which battery energy can be quickly released and the probability of explosion can be reduced. This is because the lower the SOC of the battery, the smaller the probability that the thermal runaway may occur. By releasing electric energy through the leakage loop (such as a special ground conduction loop), the hazard of battery abnormality can be reduced to the minimum.

According to the battery safety identifying method of the present embodiment, a plurality of hazard levels can be classified according to the abnormal signal, and different means can be taken in response to different hazard levels. Furthermore, the hazard levels can be set according to the result of the penetration experiment of battery internal short circuit and can be stored in the battery management system for determining the state of battery abnormality. Or, the abnormal signal can be transmitted back to the data center for analysis and comparison. Therefore, according to an embodiment of the present disclosure, a method for setting hazard levels of battery internal short circuit is provided to improve the accuracy in the determination of hazard levels of the battery.

Referring to FIG. 1, a flow diagram of a battery safety identifying method and a warning determination procedure according to an embodiment of the present disclosure is shown. The battery safety identifying method includes following steps S11-S14. Firstly, at step S11, in an ordinary recording stage, the abnormal signals, determined by at least one of battery voltage drop, the battery voltage recovery rate, the battery temperature or the battery temperature rise, will be detected and identified. If no abnormal signal is detected, the battery is determined as normal. The "voltage drop" is the voltage difference between any two adjacent time points. The "cumulative voltage drop" is obtained from the voltages measured at five adjacent time points, and is a difference obtained by deducting the average of the first three voltages from the average of the last two voltages in five adjacent time points, and the last time point is defined as the time point of the abnormal voltage drop. The "abnormal voltage drop" refers to the voltage drop whose voltage difference is smaller than −10 mV or the voltage drop whose cumulative voltage drop is smaller than or equivalent to −5 mV in the ordinary recording stage, wherein a negative value of the voltage difference represents a voltage drop. When an abnormal voltage drop occurs, a high-speed recording stage is activated, and the interval within 10 seconds following the time point at which the abnormal voltage drop occurs is referred as the "high-speed recording interval". In the ordinary recording stage, signal recording and detection is performed again every as setting time, such as 1 second. In the high-speed recording stage, signal recording and detection is performed within the high-speed recording interval following the time point at which the abnormal voltage drop occurs. Here, high-speed refers to the setting time for performing signal recording and detection again being shorter than the setting time in the ordinary recording stage. For example, the setting time for performing signal recording and detection again is shorter than 1 second. In an embodiment, the setting time for performing signal recording and detection again is 3-5 milliseconds. It should be noted that the "abnormal voltage drop" and the "cumulative voltage" disclosed above are for exemplary purpose only, and the values of corresponding parameters can be adaptatively changed according to the types, forms or constitution of the electrode material, the electrolyte or the configuration by which the battery is formed.

Figure 11:
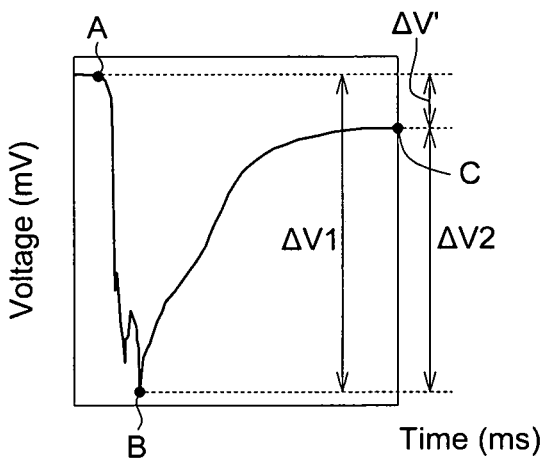
FIG. 11 is a schematic diagram of voltage change of a battery caused by penetration according to an embodiment of the present disclosure.

Refer to FIG. 11. Within the high-speed recording interval, the time point at which abnormal voltage drop occurs is referred as "time point A". The time point at which the lowest voltage is measured after time point A is referred as "time point B". Within the high-speed recording interval, the time point at which the maximum voltage is measured after time point B is referred as "time point C". Within the high-speed recording interval, the time point at which the maximum voltage is measured within a limited time interval (for example, 1 second) after time point B is referred as time point C'. The difference obtained by deducting the voltage value measured at time point A from that measured at time point B is referred as the total voltage drop ($\Delta V1$). The difference obtained by deducting the voltage value measured at time point B from that measured at time point C is referred as a recovered voltage ($\Delta V2$). If the voltage is measured within the limited time interval, time point C is replaced by time point C'. The ratio of the recovered voltage divided by the total voltage drop is referred as the voltage recovery ratio ($\Delta V2/\Delta V1 \times 100\%$).

Referring to step S12, whether the abnormal signal meets the first condition is determined. The first condition can be set as: the voltage drop must not be larger than a setting value of the first voltage drop or the voltage drop rate must not be smaller than a setting value of the voltage drop rate. For example, when the total voltage drop of the battery is not larger than 499 mV or the voltage drop rate is not smaller than −10 mV/ms, the first condition is met, and it is determined that the battery has a mild hazard. Conversely, in step S12, when the total voltage drop of the battery is larger than 499 mV or the voltage drop rate is smaller than −10 mV/ms, the first condition is not met, and it is determined that the battery at least has a moderate hazard.

Besides, in step S13, if the first condition is not met, then whether the abnormal signal meets a second condition is determined. The second condition is meeting at least one of the following requirements, including the voltage drop being not larger than a setting value of the second voltage drop, the voltage recovery ratio being larger than a setting value of the first voltage recovery ratio within a limited time interval, and the surface temperature of the battery being smaller than a setting value of the first temperature. For example, when the second condition is met, that is, the battery meets at least one of the following requirements, including the total voltage drop of the battery being not larger than 1000 mV, the voltage recovery ratio within 0.5 second being larger than 60% and the surface temperature of the battery being smaller than 85° C., it is determined that state of the battery cannot be recover, and a recalling procedure is performed. Conversely, in step S13, when the battery meets at least one of the following requirements including the total voltage drop of the battery being larger than 1000 mV, the voltage recovery ratio within a limited time interval being smaller than a setting value (for example, the voltage recovery ratio within 0.5 second being smaller than 60%) and the surface temperature of the battery being larger than a setting value (for example, higher than 85° C.), it is determined that the second condition is not met, the battery has a severe hazard, and a protection mechanism is activated to reduce the probability that the battery may have thermal runaway.

In step S14, when the first condition is met, whether the abnormal signal meets a third condition is determined. The third condition is that, within another limited time interval, the voltage recovery ratio must be larger than a setting value of the second voltage recovery ratio and/or the surface temperature of the battery must be smaller than a setting value of the second temperature. For example, within 1 second, the voltage recovery ratio of the battery is larger than 90% and/or the surface temperature of the battery is smaller than 70° C. When the third condition is met, this indicates that the battery is able to operate normally, and a normal light is displayed. Conversely, in step S14, if within another limited time interval, the voltage recovery ratio of the battery is smaller than a setting value (for example, 90%) and/or the surface temperature of the battery is within a setting range (for example, the temperature rise is in a range of 70–85° C.), then it is determined that the third condition is not met, and a warning light is displayed.

The explanations of FIG. 1 are merely an embodiment of setting hazard levels of battery abnormality. The hazard levels of battery abnormality can also be set according to any combination of voltage drop, duration time of voltage drop, voltage recovery ratio, and temperature rise. The setting of hazard levels of battery abnormality is disclosed below with reference to the flowchart of FIG. 2, but the present disclosure is not limited thereto.

Figure 2:
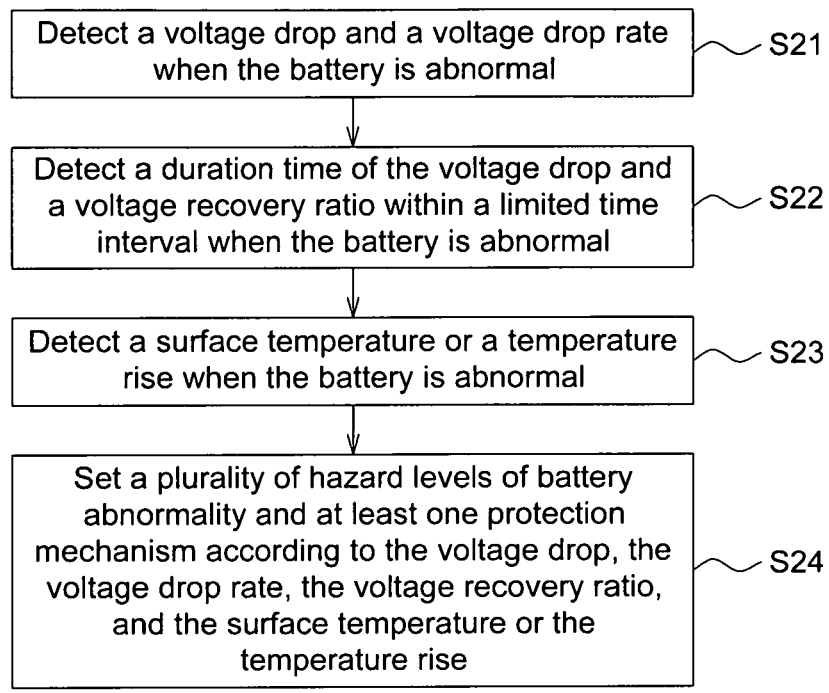
FIG. 2 is a flow diagram of each step of the battery safety identifying method according to an embodiment of the present disclosure.

Refer to FIG. 2. The battery safety identifying method may include the following steps S21-S24. In step S21, a voltage drop and a voltage drop rate are detected when the battery is abnormal. In step S22, a duration time of the voltage drop and a voltage recovery ratio within a limited time interval are detected when the battery is abnormal. In step S23, a surface temperature or a temperature rise is detected when the battery is abnormal. In step S24, a plurality of hazard levels of battery abnormality and at least one protection mechanism are set according to the voltage drop, the voltage drop rate, the voltage recovery ratio, and the surface temperature or the temperature rise.

In an embodiment, a plurality of hazard levels of battery abnormality are set with reference to FIG. 1 and FIG. 2. When the first condition is met, the battery abnormality is set as a mild hazard. When the first condition is not met but the second condition is met, the battery abnormality is set as a moderate hazard. When both the first condition and the second condition are not met, the battery abnormality is set as a severe hazard, and the protection mechanism is activated. Furthermore, the first condition is that the voltage drop must not be larger than the setting value of the first voltage drop or the voltage drop rate must not be smaller than the setting value of the voltage drop rate. The second condition is determined as at least one of the following requirements being met, including the voltage drop being not larger than the setting value of the second voltage drop, the voltage recovery ratio being larger than the setting value of the first voltage recovery ratio and the surface temperature being smaller than the setting value of the first temperature. Moreover, when the first condition is met, whether a third condition is met can be determined. If the third condition is met, this indicates that the battery is able to operate normally. The third condition is that the voltage recovery ratio must be larger than a setting value of the second voltage recovery ratio or the surface temperature must be smaller than a setting value of the second temperature.

In other embodiments, the first condition and the second condition can have different setting values and judgment criteria. To put it in greater details, when the first condition is met, the battery abnormality is set as the mild hazard, and the first condition is meeting at least one of the following requirements including the voltage drop being smaller than a first setting value, the duration time of voltage drop being smaller than a second setting value, the voltage recovery ratio being larger than a third setting value, and the temperature rise being smaller than a fourth setting value. When the second condition is meeting one or two of the requirements including the voltage drop being larger than the first setting value, the duration time of voltage drop being larger than the second setting value, the voltage recovery ratio being smaller than the third setting value and the temperature rise being larger than the fourth setting value and is met, the battery abnormality is set as the moderate hazard. When the second condition is meeting at least three of the requirements, the battery abnormality is set as the severe hazard.

In an embodiment, when the battery abnormality is set as the mild hazard and it is determined that a count of the battery abnormality occurred is more than a set count within a specific time, referring frequency as mentioned, the battery abnormality is reset as the moderate hazard. Or, when the battery abnormality is set as the moderate hazard and it is determined that the surface temperature of the battery is higher than 85° C., the battery abnormality is reset as the severe hazard. In another embodiment, when the battery abnormality is set as the moderate hazard and it is determined that the surface temperature of the battery is higher than 85° C., the protection mechanism including turning off the charging switch of the battery is activated. In an embodiment, the protection mechanism may include sending an evacuation alarm in response to battery thermal runaway, activating a forced cooling function of the battery, and opening a battery energy leakage loop.

Figure 3:
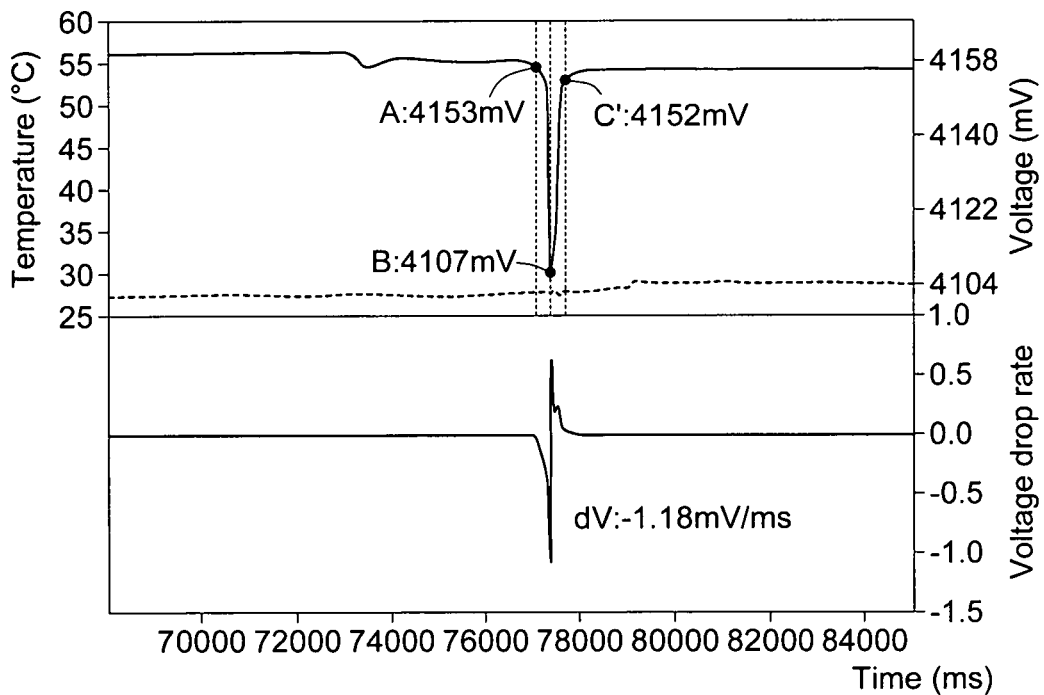
FIG. 3 is a schematic diagram of the voltage drop and the voltage recovery ratio of a battery being determined as a mild hazard.

Refer to FIGS. 1 and 3. In FIG. 3, the dotted line represents temperature change (referring to the Y coordinate of the left axis), the two solid lines respectively represent the voltage and the voltage drop rate (referring to the Y coordinate of the right axis). The battery management system, in the ordinary recording stage, detects a cumulative voltage difference of −6 mV at time point (77064 ms) and meets the activation requirement that the cumulative voltage difference must be smaller than or equivalent to −5 mV, and therefore immediately activates the high-speed recording stage. Let time point (77064 ms) be time point A. The voltage value measured at time point A is 4153 mV, and the voltage value measured at time point B (77405 ms) is 4107 mV. Since the total voltage drop is 46 mV and the voltage drop rate dV being −1.18 mV/ms is not smaller than −10 mV/ms, it is determined that the abnormal signal meets the first condition and the battery has a mild hazard. It should be noted that the voltage drop rate dV refers to the voltage difference between any two adjacent time points within a unit time. Since the voltage value measured at time point C' is 4152 mV, and the voltage recovery ratio measured within the limited time interval (1 second) being 98% is larger than the setting value being 90%, it is determined that the abnormal signal meets the third condition. This indicates that normal operation of the battery can be resumed, and a normal light is displayed. After the high-speed recording interval is over, the battery enters the ordinary recording stage.

Figure 4:
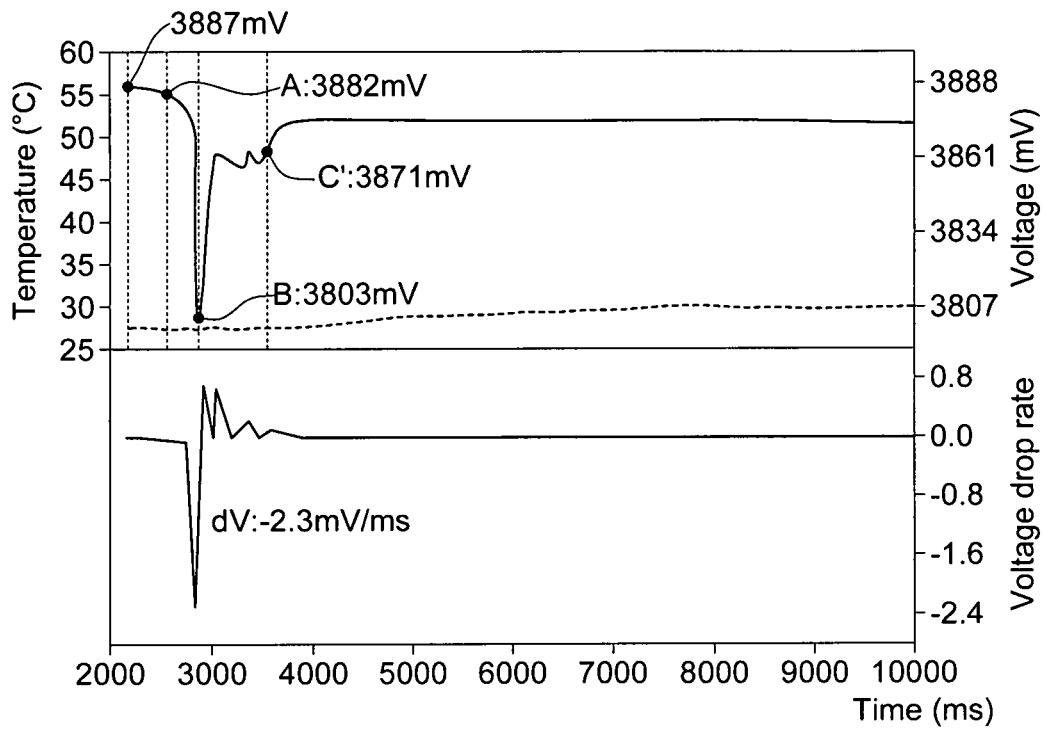
FIG. 4 is a schematic diagram of the voltage drop and the voltage recovery ratio of a battery being determined as a moderate hazard.

Referring to FIG. 1 and FIG. 4. In FIG. 4, the dotted line represents temperature change (referring to the Y coordinate of the left axis), the two solid lines respectively represent the voltage and the voltage change rate (referring to the Y coordinate of the right axis). The battery management system, in the ordinary recording stage, detects a cumulative voltage difference of −5 mV at time point (2682 ms) and meets the activation requirement that the cumulative voltage difference must be smaller than or equivalent to −5 mV, and therefore immediately activates the high-speed recording stage. Let time point (2682 ms) be time point A. The voltage value measured at time point A is 3882 mV, and the voltage value measured at time point B (2869 ms) is 3803 mV. Since the total voltage drop is 79 mV, and the voltage drop rate dV being −2.3 mV/ms is not smaller than −10 mV/ms, it is determined that the abnormal signal meets the first condition and the battery has a mild hazard. Since the voltage value measured at time point C' is 3871 mV, and the voltage recovery ratio measured within the limited time interval (1 second) being 86% is smaller than the setting value 90%, it is determined that the abnormal signal does not meet the third condition. This indicates that the battery is damaged and cannot be recovered, but there is not imminent danger. Therefore, a warning light is displayed, and after the high-speed recording interval is over, the battery enters the ordinary recording stage. In the present embodiment, it is determined that the battery is damaged and cannot be recovered, therefore the warning light signal cannot be returned to the normal light.

Figure 5:
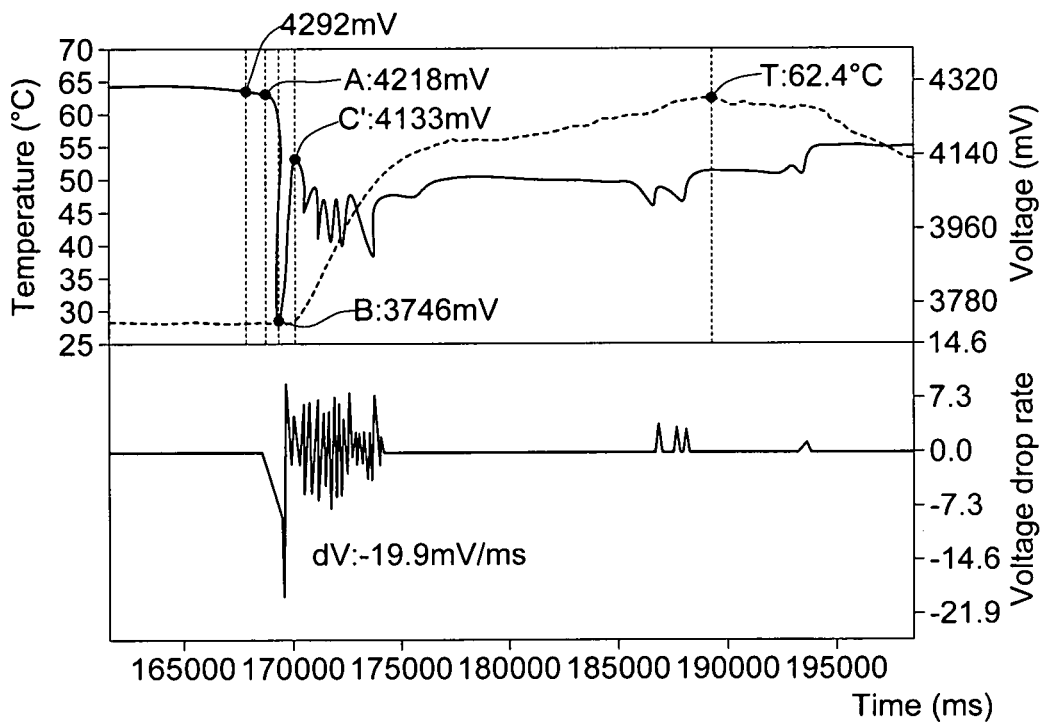
FIG. 5 is a schematic diagram of the voltage drop and the voltage recovery ratio of a battery being determined as a moderate hazard and a recall notification being activated.

Refer to FIG. 1 and FIG. 5. In FIG. 5, the dotted line represents temperature change (referring to the Y coordinate of the left axis), the two solid lines respectively represent the voltage and the voltage change rate (referring to the Y coordinate of the right axis). The battery management system, in the ordinary recording stage, detects an abnormal voltage drop of −74 mV at time point (169593 ms) and meets the activation requirement that the abnormal voltage drop must be smaller than or equivalent to −10 mV, and therefore immediately activates the high-speed recording stage. Let time point (169593 ms) be time point A. The voltage value measured at time point A is 4218 mV, and the voltage value measured at time point B (169624 ms) is 3746 mV. Since the total voltage drop is 472 mV, and the voltage drop rate dV being −19.9 mV/ms is smaller than −10 mV/ms, it is determined that the abnormal signal does not meet the first condition, and the battery has at least a moderate hazard. Since the voltage value measured at time point C' is 4133 mV, the voltage recovery ratio measured within the limited time interval (0.5 second) being 85% is larger than the setting value being 60%, and the surface temperature of the battery being 62.4° C. is smaller than the setting value being 85° C., it is determined that the abnormal signal meets the second condition, and a recall notice is displayed. In the present embodiment, since the battery has a high risk and a severe hazard, to protect user safety, the battery management system remains at the high-speed recording stage until the inspection is completed. Also, in the recall mode, the battery management system disables battery charging and reminds the user of sending the battery to the manufacturer for replacement.

Figure 6:
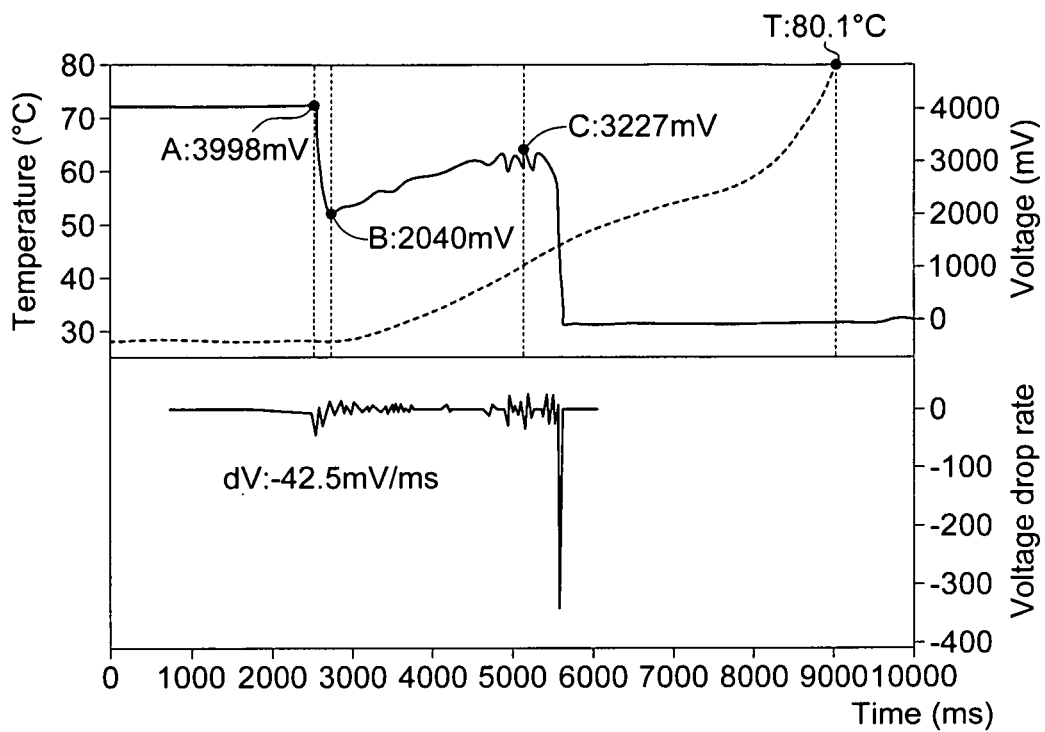
FIGS. 6-9 respectively are schematic diagrams of the voltage drop and the voltage recovery ratio of a battery being determined as a severe hazard and a protection mechanism being activated.

Refer to FIG. 1 and FIG. 6. In FIG. 6, the dotted line represents temperature change (referring to the Y coordinate of the left axis), the two solid lines respectively represent the voltage and the voltage change rate (referring to the Y coordinate of the right axis). The battery management system, in the ordinary recording stage, detects a cumulative voltage difference of −82 mV at time point (2533 ms) and meets the activation requirement that the cumulative voltage difference must be smaller than or equivalent to −5 mV, and therefore immediately activates the high-speed recording stage. Let time point (2533 ms) be time point A. The voltage value measured at time point A is 3998 mV, and the voltage value measured at time point B (2686 ms) is 2040 mV. Since the total voltage drop is 1958 mV, and the voltage drop rate is −42.5 mV/ms, the abnormal signal does not meet at least one of the requirements of the first condition including the total voltage drop being not larger than 499 mV and the voltage drop rate being not smaller than −10 mV/ms, it is determined that the battery has at least a moderate hazard. Since the voltage value measured at time point C is 3227 mV, and the total voltage drop is larger than 1000 mV, it is determined that the abnormal signal does not meet the second condition. This indicates that the battery has a severe hazard, therefore a protection light is displayed, and a protection mechanism is activated to perform forced discharging, forced dissipation, or actuate fire extinguishing equipment. The experiment of the present embodiment shows that there are 8 seconds of reaction time available from the activation of the protection mechanism to the explosion of the battery, therefore people would have enough time to evacuate.

Figure 7:
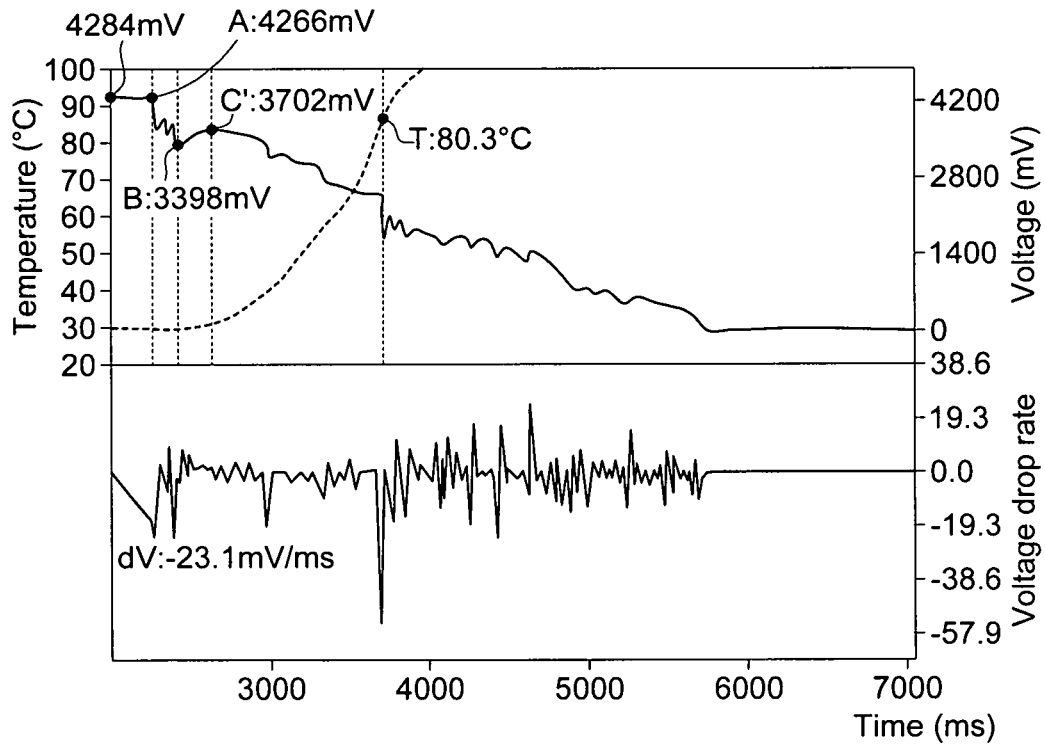

Refer to FIG. 1 and FIG. 7. In FIG. 7, the dotted line represents temperature change (referring to the Y coordinate of the left axis), the two solid lines respectively represent the voltage and the voltage change rate (referring to the Y coordinate of the right axis). The battery management system, in the ordinary recording stage, detects an abnormal voltage drop of −18 mV at time point (2001 ms) and meets the activation requirement that the abnormal voltage drop must be smaller than or equivalent to −10 mV, and therefore immediately activates the high-speed recording stage. Let time point (2001 ms) be time point A. The voltage value measured at time point A is 4266 mV, and the voltage value measured at time point B (2261 ms) is 3398 mV. Since the total voltage drop is 868 mV, the voltage drop rate dV is −23.1 mV/ms, and the total voltage drop is larger than 499 mV and/or the voltage drop rate is smaller than −10 mV/ms, it is determined that the abnormal signal does not meet the first condition, and the battery has at least a moderate hazard. Since the voltage value measured at time point C' is 3702 mV, the voltage recovery ratio measured within the limited time interval (0.5 second) being 35% is smaller than the setting value 60%, and the surface temperature of the battery being 80.3° C. is smaller than the setting value being 85° C., and the voltage recovery ratio within 0.5 second is smaller than 60%, it is determined that the abnormal signal does not meet the second condition, the battery has a severe hazard, and a protection mechanism is activated.

Figure 8:
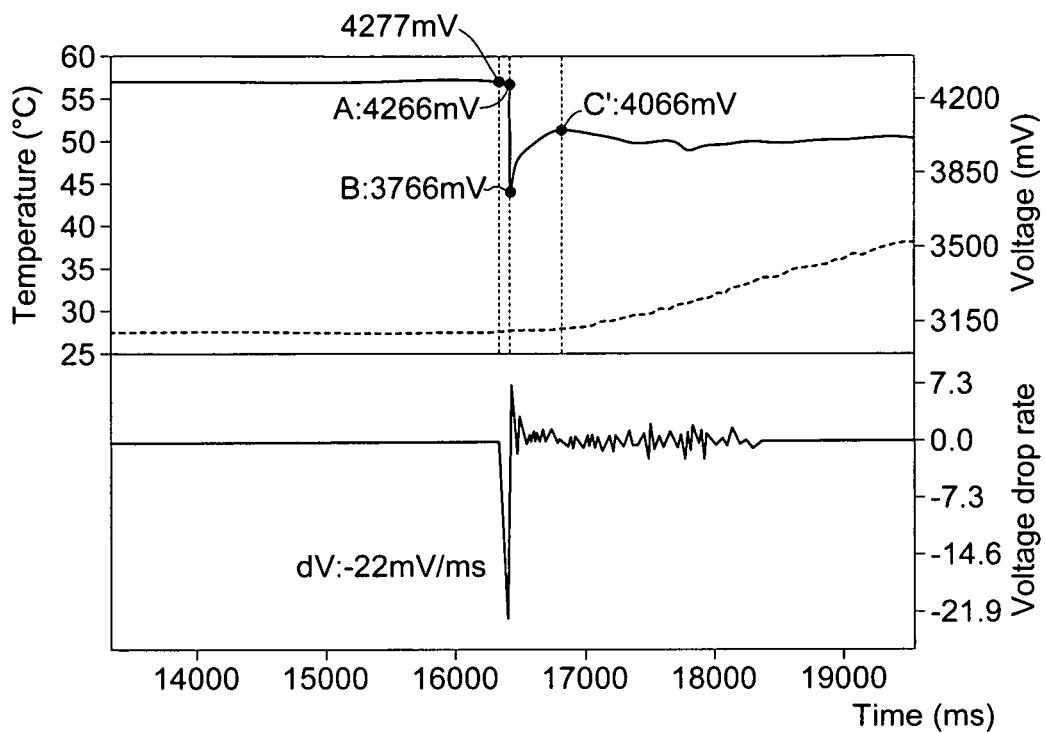

Refer to FIG. 1 and FIG. 8. In FIG. 8, the dotted line represents temperature change (referring to the Y coordinate of the left axis), the two solid lines respectively represent the voltage and the voltage change rate (referring to the Y coordinate of the right axis). The battery management system, in the ordinary recording stage, detects an abnormal voltage drop of −11 mV at time point (16344 ms) and meets the activation requirement that the abnormal voltage drop must be smaller than or equivalent to −10 mV, and therefore immediately activates the high-speed recording stage. Let time point (16344 ms) be time point A. Since the voltage value measured at time point A is 4266 mV, and the voltage value measured at time point B (16427 ms) is 3766 mV. Since the total voltage drop is 500 mV, and the voltage drop rate is −22 mV/ms, the total voltage drop is larger than 499 mV and/or the voltage drop rate is smaller than −10 mV/ms, it is determined that the abnormal signal does not meet the first condition, and the battery has a moderate hazard. Since the voltage value measured at time point C' is 4066 mV, the voltage recovery ratio measured within the limited time interval of 0.5 second is 60%, and the surface temperature of the battery at time point (91344 ms) is larger than the setting value being 85° C. (not illustrated in the diagram), the further judgment requirement of the surface temperature of the battery being higher than 85° C. is met. Therefore, a protection light is displayed and a protection mechanism is activated. The experiment of the present embodiment shows that there are 335 seconds of reaction time available from the activation of the protection mechanism to the explosion of the battery, therefore people would have enough time to evacuate.

Figure 9:
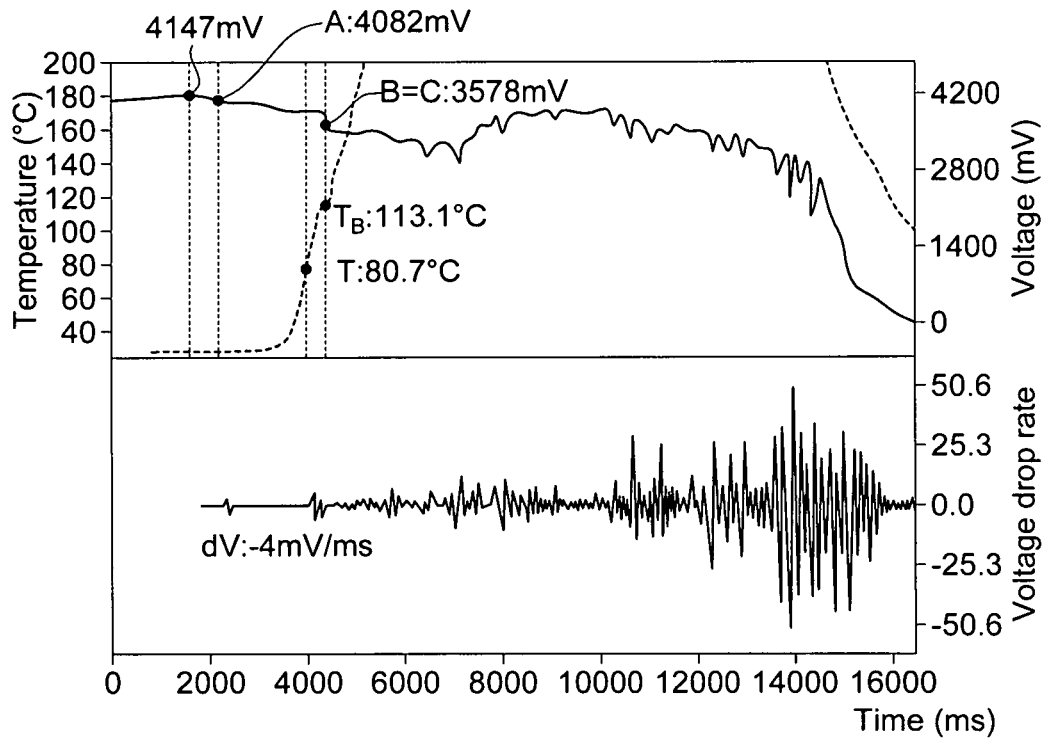

Refer to FIG. 1 and FIG. 9. In FIG. 9, the dotted line represents temperature change (referring to the Y coordinate of the left axis), the two solid lines respectively represent the voltage and the voltage change rate (referring to the Y coordinate of the right axis). The battery management system, in the ordinary recording stage, detects an abnormal voltage drop of −65 mV at time point (2386 ms) and meets the activation requirement that the abnormal voltage drop must be smaller than or equivalent to −10 mV, and therefore immediately activates the high-speed recording stage. Let time point (2386 ms) be time point A. The voltage value measured at time point A is 4082 mV, and the voltage value measured at time point B (4295 ms) is 3578 mV. Since the total voltage drop is 504 mV, the voltage drop rate is −4 mV/ms, and the total voltage drop is larger than 499 mV, it is determined that the abnormal signal does not meet the first condition, and the battery has at least a moderate hazard. Since the time from time point A to time point B is over the limited time interval, time point B is equivalent to time point C. Since the voltage recovery ratio is 0%, and the surface temperature of the battery being 113° C. at time point B is larger than the setting value being 85° C., the voltage recovery ratio within 0.5 second is smaller than 60% or the surface temperature of the battery is higher than 85° C., it is determined that the abnormal signal does not meet the second condition, and the battery has a severe hazard. Therefore, a protection light is displayed and a protection mechanism is activated. As indicated in FIG. 9, after 5000 ms, the battery temperature is over 200° C., and severe hazard will be caused.

Figure 10:
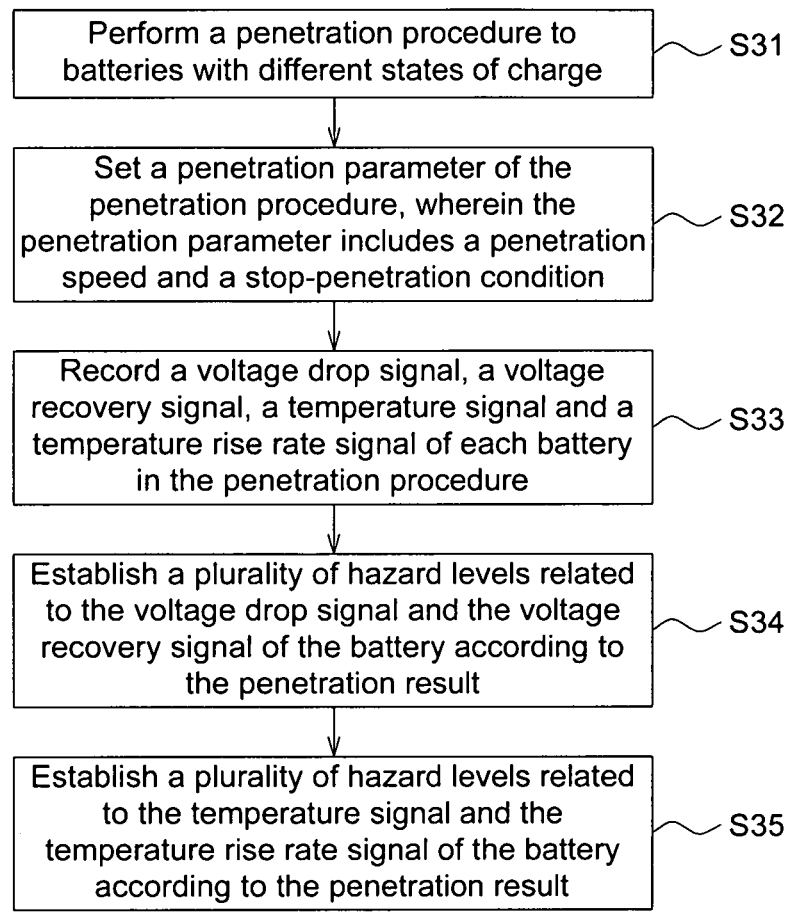
FIG. 10 is a flowchart of a method for setting hazard levels of internal short circuit of a battery according to an embodiment of the present disclosure.

Refer to FIG. 10. The method for setting hazard levels of internal short circuit of a battery includes steps S31-S35. In step S31, a penetration procedure is performed to batteries with different states of charge. In step S32, a penetration parameter of the penetration procedure is set, wherein the penetration parameter includes a penetration speed and a stop-penetration condition. In step S33, a voltage drop signal, a voltage recovery signal, a temperature signal and a temperature rise rate signal of each battery are recorded in the penetration procedure. In step S34, a plurality of hazard levels related to the voltage drop signal and the voltage recovery signal of the battery are established according to the penetration result. In another embodiment, the method may further include step S35, a plurality of hazard levels related to the temperature signal and the temperature rise rate signal of the battery are established according to the penetration result.

The penetration procedure is performed to a battery mainly using a nail and a computer. The computer records a signal versus the time, establishes a database of the signal and the penetration result of the battery, and further determines battery safety according to the database. In the present embodiment, the battery can be a 4.8 Ah wound pouch battery or a 10 Ah stacked pouch battery. However, the battery can be any type, and is not limited to the above exemplifications. The battery can be pre-charged or pre-discharged to achieve the selected state of charge (SOC) being 50%, 75% or 100%. It should be noted that the selected states of charge can be in a range of 30-100%, and are not limited to the above exemplifications. During the experiment, more than one state of charge can be selected for the penetration procedure according to the types, forms or constitution of the electrode material, the electrolyte or the configuration by which the battery is formed.

The computer sets the penetration parameter and the stop-penetration condition and records the penetration result. The penetration parameter may include a penetration speed signal. The penetration speed is such as 0.01 mm/s, 0.1 mm/s, 2 mm/s, 5 mm/s, 7 mm/s, 10 mm/s, 15 mm/s, or 30 mm/s. The stop-penetration condition is that the voltage drop must be larger than the setting value (for example, 300 mV) and/or the penetration depth must reach the setting value. The parameters of the nail include the type and the nail diameter. The nail can be formed of an insulating material such as alumina or glass fiber. The nail diameter can be 3 mm or other sizes. It should be noted that the penetration speed can be in a range of 0.01-50 mm/s, the setting value of the voltage drop of the stop-penetration condition can be in a range of 100-1000 mV, and the setting value of the penetration depth can be 10-100% of the thickness of the battery, but the present disclosure is not limited to the above exemplifications. Furthermore, the stop-penetration condition can be defined by both the setting value of the voltage drop and the setting value of the penetration depth, and when any one of the conditions is met, nail penetration immediately stops. In other embodiments, the stop-penetration condition can be defined by either set the setting value of the voltage drop or the setting value of the penetration depth, but the present disclosure is not limited thereto.

Furthermore, control signals, such as the voltage drop signal, the voltage recovery signal, the temperature signal, the temperature rise rate signal, the penetration parameter, and the stop-penetration condition, generated by the battery during the penetration procedure can be transmitted to the computer via a signal transmission unit.

Refer to FIG. 11 and FIG. 12. FIG. 11 is a schematic diagram of voltage change of battery caused by penetration. FIG. 12 is a schematic diagram of creating battery hazard levels according to the state of charge and penetration parameters. In FIG. 11, time point A is the time point at which an abnormal voltage drop signal is generated; $\Delta V1$ is the voltage difference obtained by deducting the lowest voltage measured at time point B from the voltage measured at time point A; $\Delta V2$ is the voltage difference obtained by deducting the lowest voltage measured at time point B from the voltage measured at time point C; $\Delta V'$ ($=\Delta V1-\Delta V2$) is the voltage difference obtained by deducting the voltage measured at time point C from the voltage measured at time point A. Generally speaking, the larger the voltage difference $\Delta V'$, the larger the volume of energy released by the battery internal short circuit. As indicated in FIG. 12, the higher the state of charge, the larger the short circuit energy, and the more severe the hazard caused by the battery internal short circuit.

Refer to FIG. 12. In an embodiment, a penetration procedure is performed to a 4.8 Ah battery with 50% SOC, a 3 mm nail is used, the penetration speed is set as 7 mm/s, a stop-penetration condition is set as the voltage drop reaching 300 mV, the voltages at time point A, time point B and time point C are measured, and a penetration result is obtained. Then, if several penetration results are obtained when the penetration speed is changed to 30 mm/s from 7 mm/s, the hazard level can be classified as stable category (safe), para-stable category (warning) and unstable category (dangerous) according to the penetration results. The penetration results can be classified according to the hazard levels defined by the EUCAR, wherein the stable category is in a range of hazard levels 0-1, the para-stable category is in a range of hazard levels 2-4, and the unstable category is in a range of hazard levels 5-7.

In an embodiment, when the penetration speed 7 mm/s is increased to 30 mm/s, the voltages at time point A, time point B and time point C are measured. If the voltage drop is not larger than a setting value (for example, the total voltage drop $\Delta V1$ is not larger than 499 mV) or the voltage recovery ratio is larger than a setting value (for example, the voltage recovery ratio $\Delta V2/\Delta V1$ within 0.5 second is larger than 60%), then the hazard level is set as the safe level. If the voltage drop is larger than a setting value (for example, the total voltage drop $\Delta V1$ is larger than 499 mV) or the voltage recovery ratio is smaller than a setting value (for example, the voltage recovery ratio $\Delta V2/\Delta V1$ within 0.5 second is smaller than 60%), then the hazard level is set as a warning level or a dangerous level.

Then, as indicated in FIG. 12, a penetration procedure is performed to a 4.8 Ah battery with 100% SOC, a 3 mm nail is used, the penetration speed is set as 5 mm/s, a stop-penetration condition is set as the voltage drop reaching 300 mV, the voltages at time point A, time point B and time point C are measured, and a penetration result is obtained. Then, if different penetration results are obtained when the penetration speed is decreased to 0.01 mm/s from 5 mm/s, a database can be established by changing the state od charge of the battery during test and completing all penetration procedures within all ranges of penetration speed, such that the correlation table of FIG. 12 can be completed.

Refer to FIG. 13. In another embodiment, a penetration procedure is performed to a 10 Ah battery with 50% SOC, a 3 mm nail is used, the penetration speed is set as 5 mm/s, and a stop-penetration condition is set as the voltage drop reaching 300 mV. If different penetration results are obtained when the penetration speed is increased to 30 mm/s from 5 mm/s, the hazard levels can be classified as stable category (safe), para-stable category (warning) and unstable category (dangerous) according to the penetration results. Then, a penetration procedure is performed to 10 Ah battery with 100% SOC, and the penetration speed is decreased to 0.01 mm/s from 7 mm/s. If different penetration results are obtained, a database can be established by changing the state of charge and completing all penetration procedures within all ranges of penetration speed, such that the correlation table of FIG. 13 can be completed.

According to the present embodiment disclosed above, a plurality of hazard levels (for example, safe, warning, and dangerous) related to the voltage drop and the voltage recovery signal of the battery can be established by changing the state of charge and the penetration parameters. Moreover, after the correlation between the penetration parameter and the temperature rise of the battery is obtained from the above penetration results, in another embodiment a plurality of hazard levels (for example, safe, warning, and dangerous) related to the temperature signal and temperature rise rate signal of the battery can be obtained by changing the state of charge and the penetration parameters.

Therefore, the penetration result and related hazard levels can be stored in the battery management system for the battery management system to set the setting value of each condition and perform the battery safety identifying method to determine the state of battery abnormality.

Refer to FIGS. 14 and 15. FIG. 14 is a correlation table of battery hazard levels created according to the voltage drop and the voltage recovery rate when the state of charge is high than 75%. FIG. 15 is a correlation table of battery hazard levels created according to the battery temperature and the temperature rise rate when the state of charge is higher than 75%. The voltage drop can be divided into three levels (smaller than 50 mV, between 50-100 mV, and larger than 100 mV). The voltage recovery rate can be divided into three levels (larger than 10 mV/s, between 1-10 mV/s, and smaller than 1 mV/S). The temperature can be divided into three levels (smaller than 70° C., between 70-85° C., and higher than 85° C.). The temperature rise rate can be divided into three levels (smaller than 1.5° C./s, between 1.5-5° C./s, and larger than 5° C./s).

At the initial stage, the battery internal short circuit is mainly determined according to the voltage drop and the voltage recovery rate of the battery when the battery remains at the warning state and the dangerous state. Then, in the middle and the late stages, the battery internal short circuit is mainly determined according to the temperature signal and the temperature rise rate of the battery, and is partly determined according to the voltage signal.

Refer to FIGS. 16 and 17. FIG. 16 is a correlation table of battery hazard levels created according to the voltage drop and the voltage recovery rate when the state of charge is in a range of 50-75%. FIG. 17 is a correlation table of battery hazard levels created according to the battery temperature and the temperature rise rate when the state of charge is in a range of 50-75%. The voltage drop can be divided into four levels (smaller than 50 mV, between 50-100 mV, between 100-200 mv, and larger than 200 mV). The voltage recovery rate can be divided into three levels (larger than 10 mV/s, between 1-10 mV/s, and smaller than 1 mV/S). The temperature can be divided into three levels (smaller than 70° C., between 70-85° C., and higher than 85° C.). The temperature rise rate can be divided into three levels (smaller than 1.5° C./s, between 1.5-5° C./s, and larger than 5° C./s).

At the initial stage, the internal short circuit of the battery is mainly determined according to the voltage drop and the voltage recovery rate of the battery when the battery remains at the warning state and the dangerous state. Then, in the middle and the late stages, the internal short circuit of the battery is mainly determined according to the temperature signal and the temperature rise rate of the battery, and is partly determined according to the voltage signal.

Refer to FIGS. 18 and 19. FIG. 18 is a correlation table of battery hazard levels created according to the voltage drop and the voltage recovery rate when the state of charge is lower than 50%. FIG. 19 is a correlation table of battery hazard levels created according to the battery temperature and the temperature rise rate when the state of charge is lower than 50%. The voltage drop can be divided into four levels (smaller than 50 mV, between 50-100 mV, between 100-200 mv, and larger than 200 mV). The voltage recovery rate can be divided into three levels (larger than 10 mV/s, between 1-10 mV/s, and smaller than 1 mV/S). The temperature can be divided into three levels (smaller than 70° C., between 70-85° C., and higher than 85° C.). The temperature rise rate can be divided into three levels (smaller than 1.5° C./s, between 1.5-5° C./s, and larger than 5° C./s).

At the initial stage, the internal short circuit of the battery is mainly determined according to the voltage drop and the voltage recovery rate of the battery when the battery remains at the warning state and the dangerous state. Then, in the middle and the late stages, the internal short circuit of the battery is mainly determined according to the temperature signal and the temperature rise rate of the battery, and is partly determined according to the voltage signal.

Refer to FIGS. 14-19. According to the method for setting hazard levels of internal short circuit of a battery in the above embodiments, related hazard levels can be arranged in a table, which shows hazard levels in the initial, the middle, and the late stages under different states of charge. Furthermore, different hazard levels in the table can be represented in different color blocks. For example, the safe level can be represented in a green block, the warning level can be represented in a yellow block, and the dangerous level can be represented in a red block, such that the hazard levels can be listed in the battery manual for the user's reference.

According to above disclosure, a warning system for identifying hazard levels of battery is provided. The warning system includes a battery management system and an alarm system. The battery management system is configured to perform a battery safety identifying method to determine the state of battery abnormality. The battery management system includes a micro-computer, a temperature sensor, a voltage sensor and a wireless communication board. The alarm system includes a display screen and a sound amplifier, and is configured to display a light or emit an alarm according to the hazard levels. As indicated in FIG. 1, the judgment logic of the battery management system includes four stages and at least four decision steps. The stages include ordinary recording stage, high-speed recording stage, warning or recall stage, and activation stage. At least one decision step exists between every two stages. In the ordinary recording stage of the judgment logic of the battery management system, in every second, the data transmitted back from the temperature sensor and the voltage sensor are written to the micro-computer and are computed. In the decision step between the ordinary recording stage and the high-speed recording stage of the judgment logic of the battery management system, an abnormal voltage drop signal is formed by performing mathematical computation to the voltage vs time signal of the database. The decision step of the battery management system adopts one of the calculations composed of: calculating the difference between the voltage measured at a time point and the voltage measured at another time point, calculating the difference between the average voltage measured at a time point and the average voltage measured at another time point, dividing any of the said value by the time interval, and a combination thereof. In the judgment logic of the battery management system, the decision step between the high-speed recording stage and the recall or warning stage, after abnormal voltage drop occurs, adopts one of the calculations composed of: calculating the difference between the voltage measured at a time point and the voltage measured at another time point, calculating the difference between the average voltage measured at a time point and the average voltage measured at another time point, dividing any of the said value by the time interval, and a combination thereof. The absolute value of the value obtained in the decision step shall not be lower than the abnormal voltage drop. In the judgment logic of the battery management system, the decision step between the recall or warning stage and the actuation stage is determined according to the difference between the voltage measured at a time point and the voltage measured at another time point, the difference between the average voltage measured at a time point and the average voltage measured at another time point, the temperature measured at a time point, or the product or quotient of the said voltage differences.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A battery safety identifying method, comprising:
   detecting a voltage drop and a voltage drop rate when a battery is abnormal;
   detecting a duration time of the voltage drop and a voltage recovery ratio within a limited time interval when the battery is abnormal;
   detecting a surface temperature or a temperature rise when the battery is abnormal; and
   setting a plurality of hazard levels of battery abnormality and at least one protection mechanism according to the voltage drop, the voltage drop rate, the voltage recovery ratio, and the surface temperature or the temperature rise;
   wherein, when a first condition is met, the battery abnormality is set as a mild hazard, when the first condition is not met and a second condition is met, the battery abnormality is set as a moderate hazard; when the first condition is not met and the second condition is not met, the battery abnormality is set as a severe hazard, and the at least one protection mechanism is activated.

2. The method according to claim 1, wherein the first condition is that the voltage drop is not larger than a setting value of a first voltage drop or the voltage drop rate is not smaller than a setting value of the voltage drop rate, and the second condition is meeting at least one of the following requirements comprising the voltage drop being not larger than a setting value of a second voltage drop, the voltage recovery ratio being larger than a setting value of a first voltage recovery ratio, and the surface temperature being smaller than a setting value of a first temperature.

3. The method according to claim 2, wherein when the first condition is met, the method further determines whether a third condition is met: if the third condition is met, this indicates that the battery resumes normal operation, and the third condition is that the voltage recovery ratio is larger than a setting value of a second voltage recovery ratio or the surface temperature is smaller than a setting value of a second temperature.

4. The method according to claim 1, wherein when the first condition is meeting at least one of the requirements comprising the voltage drop being smaller than a first setting value, the duration time of voltage drop being smaller than a second setting value, the voltage recovery ratio being larger than a third setting value, and the temperature rise being smaller than a fourth setting value and is met, the battery abnormality is set as the mild hazard.

5. The method according to claim 4, wherein when the second condition is meeting one or two of the requirements comprising the voltage drop being larger than the first setting value, the duration time of voltage drop being larger than the second setting value, the voltage recovery ratio being smaller than the third setting value and the temperature rise being larger than the fourth setting value and is met, the battery abnormality is set as the moderate hazard; when the second condition is met at least three of the requirements, the battery abnormality is set as the severe hazard.

6. A method for setting hazard levels of internal short circuit of a battery, comprising:
   performing a penetration procedure to batteries with different states of charge;
   setting a penetration parameter of the penetration procedure, wherein the penetration parameter comprises a penetration speed and a stop-penetration condition;
   recording a voltage drop signal, a voltage recovery signal, a temperature signal and a temperature rise rate signal of each of the batteries in the penetration procedure; and
   establishing a plurality of hazard levels related to the voltage drop signal and the voltage recovery signal of the battery according to the penetration result.

7. A warning system for identifying hazard levels of a battery, comprising:
   a battery management system configured to perform the safety identifying method as disclosed in claim 1 to determine states of battery abnormality according to the hazard levels; and
   an alarm system configured to display a light or emit an alarm according to the hazard levels.

8. The method according to claim 1, wherein when the battery abnormality is set as the mild hazard and it is determined that a count of battery abnormality is larger than a set count within a specific time, the battery abnormality is reset as the moderate hazard.

9. The method according to claim 1, wherein when the battery abnormality is set as the moderate hazard and it is determined that the surface temperature of the battery is lower than 85° C., the at least one protection mechanism, which comprises turning off the charging function of the battery, is activated.

10. The method according to claim 1, wherein when the battery abnormality is set as the moderate hazard and it is determined that the surface temperature of the battery is higher than 85° C., the battery abnormality is reset as the severe hazard.

11. The method according to claim 1, wherein the at least one protection mechanism comprises at least one of sending a battery thermal runaway evacuation alarm, activating a forced cooling function of the battery and opening a leakage loop of the battery.

12. The method according to claim 6, further comprising: storing the hazard levels to a battery management system, which performs the safety identifying method as disclosed in claim 1 to determine states of battery abnormality according to the hazard levels.

13. The method according to claim 12, further comprising establishing a plurality of hazard levels related to the temperature signal and the temperature rise rate signal of the battery according to the penetration result.

14. The method according to claim 12, wherein the different states of charge respectively are in a range of 30-100%.

15. The method according to claim 12, wherein the penetration speed is set to be in a range of 0.01-50 mm/s.

16. The method according to claim 12, wherein the stop-penetration condition is that the voltage drop signal is larger than a setting value, which is in a range of 100-1000 mV.

17. The method according to claim 10, wherein the stop-penetration condition is that a penetration depth is larger than a setting value, which is in a range of 10-100% of a thickness of the battery.

* * * * *